United States Patent [19]
Borrelli et al.

[11] Patent Number: 6,133,721
[45] Date of Patent: Oct. 17, 2000

[54] GLASS FIBER CURRENT SENSOR AND METHOD OF USE THEREFOR

[75] Inventors: Nicholas F. Borrelli, Elmira, N.Y.;
Yves A H Brocheton, Fontenaysous-Bois; Alexandre M. Mayolet, Chartres, both of France

[73] Assignee: Corning Incorporated, Corning, N.Y.

[21] Appl. No.: 09/350,067

[22] Filed: Jul. 8, 1999

Related U.S. Application Data

[60] Provisional application No. 60/116,699, Jan. 22, 1999.

[51] Int. Cl.$^7$ .................................................. G01R 31/00

[52] U.S. Cl. ....................................... 324/96; 250/227.17

[58] Field of Search ....................... 324/96; 250/227.14, 250/227.17, 227.18, 231.1; 356/385, 368

[56] References Cited

U.S. PATENT DOCUMENTS

| | | | |
|---|---|---|---|
| 1,295,299 | 2/1919 | Gage | 501/60 |
| 1,411,133 | 3/1922 | Taylor et al. | 501/60 |
| 3,633,992 | 1/1972 | Uchida et al. | 359/484 |
| 4,348,587 | 9/1982 | Tangonan et al. | 250/227.14 |
| 4,634,852 | 1/1987 | Shaw | 250/227.19 |
| 5,450,006 | 9/1995 | Tatam | 324/96 |

*Primary Examiner*—Safet Metjahic
*Assistant Examiner*—Russell M. Kobert
*Attorney, Agent, or Firm*—Philip G. Alden

[57] ABSTRACT

A glass fiber sensor for measuring an electrical current, the glass fiber core being a heavy flint glass having its composition modified by the addition to the glass composition of a source of a selected rare earth ion, whereby the Verdet constant value of the glass is reduced without unduly increasing the value of the photoelastic coefficient.

17 Claims, 1 Drawing Sheet

GLASS FIBER CURRENT SENSOR AND METHOD OF USE THEREFOR

This application claims the benefit of priority under 35 U.S.C. §119 from the European Patent Application Number 99400015.6, filed Jan. 5, 1999 and U.S. provisional application Ser. No. 60/116,699, filed Jan. 22, 1999.

FIELD OF THE INVENTION

The invention relates broadly to measurement of electrical currents and sensing devices for that purpose.

BACKGROUND OF THE INVENTION

Fiber optic, current sensors, based on the Faraday effect, have a number of advantages for remotely measuring electrical currents. These include wide dynamic range, fast response, immunity to electromagnetic interference, small size, and low cost. Consequently, a variety of fiber optic, current sensors have been investigated in recent years. Mainly, they have employed a single mode, optical fiber (SMF) of clad silica.

These sensors have not yet reached the stage of practical field use due to lack of accuracy and stability. This is mainly due to intrinsic and induced, linear birefringences that degrade the contrast when the Faraday rotation method is used. A particular problem arises from the fact that these birefringences are easily generated in sensing elements employing silica fibers.

The Faraday effect is a phenomenon by which a linear, polarized light will rotate when propagating through a transparent material that is positioned in a magnetic field in parallel with the magnetic field. The size of the rotation angle ($\theta$), given in degrees, is defined as $$\theta = VHL \tag{1}$$

where H is the strength of the magnetic field (A/m), V is the Verdet constant of the material, and L is the path length over which the magnetic field acts (m).

The magnetic field strength is measured in terms of Amperes (A) times turns (T) per unit length (AT/m) where m is meters. Since values are expressed in terms of one turn, this factor is usually implicit, rather than explicit. Hence, the strength is customarily given in amperes (A), or kiloamperes (kA), per unit path length in meters (m).

The Verdet constant, V, is the angle of rotation divided by the magnetic field strength per unit length. The angle may be expressed in any of the customary units for angle measurement, but degrees are used here. Verdet constant values, unless otherwise indicated, are given in terms of degrees divided by field strength expressed as (kA×T/m)m.

The magnitude of the magnetic induction (B) around an infinite, straight conductor is given by the expression:

$$B = (\mu_o/4\pi)(2I/a) \tag{2}$$

where I is the current, $\mu_o$ is permittivity of free space, and a is the radial distance of the magnetic field from the conductor. The magnetic field is related to the magnetic induction by the simple relation:

$$B = \mu_o H. \tag{3}$$

Combining equations 1 through 3 gives a proportional relation between the rotation and the current such that:

$$\theta = VI \tag{4}$$

where $\theta$ is in degrees, V is the Verdet constant, and I is in kiloamperes (kA). Thus, the sensitivity of a method for measuring a current depends on how accurately the angular rotation can be measured.

The degree of sensitivity in measuring the angular rotation is influenced by another factor; birefringence. Birefringence arises primarily from stresses that result from bending, or otherwise distorting, a fiber in its disposition. The sources of linear birefringence in single mode fibers include residual stress from fabrication, bending, contact, and thermal stresses (Yamashita et al., "Extremely Small Stress-optic Coefficient Glass Single Mode Fibers For Current Sensor", Optical Fiber Sensors, Sapporo Japan, paper We2–4, page 168 (1996) ("Yamashita")).

The stress-induced birefringence is quantified in terms of a coefficient, called the photoelastic constant (or the photoelastic coefficient). The photoelastic coefficient ($B_p$) may be defined as the coefficient relating the difference in the refractive indices in the stress direction (n(par)) and in the perpendicular direction (n(per)), to the magnitude of the applied stress:

$$n(par) - n(per) = B_p \sigma \tag{5}$$

It may also be regarded as the phase shift measured in units of wavelength in nanometers (nm) per path length in centimeters (cm) divided by the stress in kilograms per square centimeter (kg/cm$^2$). The values then are in units of (nm/cm divided by kg/cm$^2$).

An ideal glass fiber will have a photoelastic coefficient of zero, thereby nullifying any effect of stress-induced birefringence. However, this has proven difficult to obtain in conjunction with an appropriate Verdet constant. Certain applications require that a current sensor must be designed to provide a single, accurate value for a current regardless of current intensity, or total length of the sensor.

Current measurement during normal, stable operations presents no special problem. However, a problem can arise when it becomes necessary to measure an exceptionally large current. Such a current may arise, for example, from a surge or fault caused by a line failure, such as a short circuit.

In measuring such a current, unless a fiber has a small Verdet constant, there is the risk of creating an angle of rotation greater than 90 degrees. In that case, the angle will register the same as an angle of less than 90 degrees, thus bringing the measurement into question. This is particularly serious where a double pass measurement is made.

It is necessary, then, that the angle of rotation imparted to polarized light by a current passing through a fiber sensor does not exceed 90 degrees. Actually, it is desirable that the angle not even approach 90 degrees regardless of current intensity. An acceptable glass fiber sensor must meet this requirement in the event the current being measured is exceptionally large.

It is a purpose of the present invention to provide a novel, glass fiber sensor for measuring electrical currents.

Another purpose is to provide a glass having a combination of properties that make the glass useful to function as such novel sensor.

A further purpose is to provide a modified, heavy flint glass having the combination of properties required for use in the sensor for a current measuring device.

A still further purpose is to provide a method of reducing the Verdet constant value of a heavy flint glass to permit accurate measurement of an electrical current even when that current is exceptionally large.

Another purpose is to provide a novel composition for the core of a glass fiber to be used in the sensor of a measuring device for electrical currents.

SUMMARY OF THE INVENTION

The invention resides in part in a glass fiber sensor for measuring an electrical current when the sensor is positioned in a magnetic field created by the current, the glass fiber sensor having a core composed of a heavy flint glass modified by incorporating in the glass composition a source of a rare earth ion that imparts paramagnetic behavior to the glass.

The invention further resides in a heavy flint glass having a composition consisting essentially of lead and silicon oxides and a source of a rare earth ion that imparts paramagnetic behavior to the glass.

The invention also resides in a method of reducing the Verdet constant of a heavy flint glass while not unduly increasing the photoelastic coefficient of the glass, the method comprising incorporating in the glass composition a source of a rare earth ion that imparts paramagnetic behavior to the glass.

Another aspect of the invention is a method of determining a magnitude of an electrical current which comprises, providing a glass fiber, current sensor, the core glass of which is a heavy flint glass containing, in its composition, a source of a rare earth ion that imparts paramagnetic behavior to the glass, passing a current through a conductor to create a magnetic field surrounding the conductor, positioning the current sensor within the magnetic field thus created, propagating polarized light into the glass fiber, current sensor, measuring the angle of rotation of the polarized light in the glass fiber sensor, and determining the magnitude of the current from the angle of rotation of the polarized light.

DESCRIPTION OF THE DRAWING

The single FIGURE in the accompanying drawing illustrates a current measuring device adapted to use in practicing the present invention.

DESCRIPTION OF THE INVENTION

Figure 1:
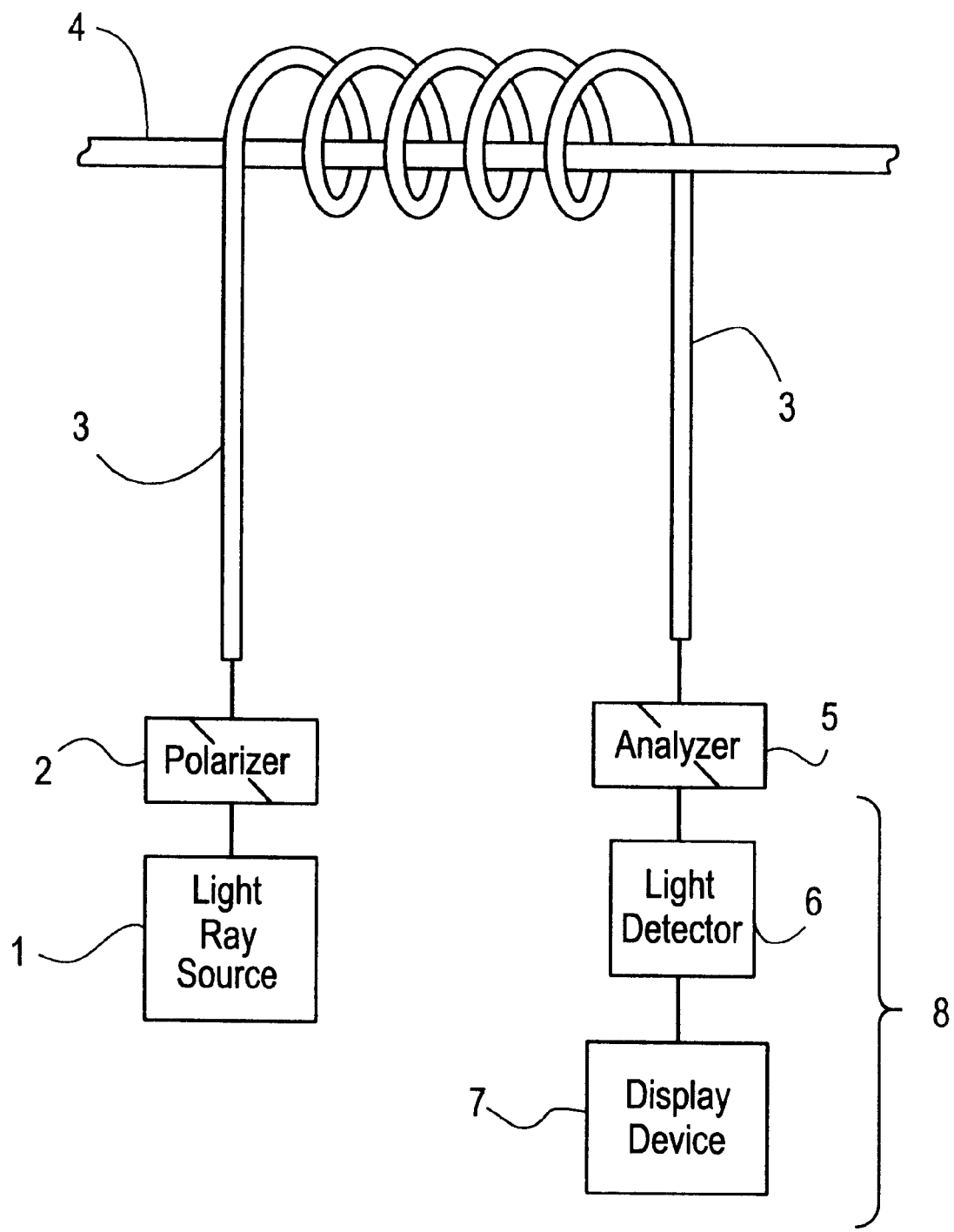

The present invention relates to determining the magnitude of an electrical current. It relates particularly to a glass fiber sensor for use in such determination, and to a method of using the sensor in making that determination.

The magnitude of the current is determined by measuring the angle of rotation that the current creates in polarized light, as that light is transmitted through a fiber in a magnetic field created by the current. The angle of rotation is less when the glass from which the fiber is drawn has a low Verdet constant. In particular, a fiber produced from a heavy flint glass in accordance with the present invention will usually have a Verdet constant that is less than 0.30°/kA., preferably less than 0.25°/kA. Therefore, when the fiber is exposed to an exceptionally large current, it will register an angle of rotation less than 90°, and will accurately measure the current.

Reference to a fiber signifies a clad fiber comprising essentially a fiber core and an outer, cladding layer covering the core. The fiber core is the functional member for current measurement. However, it is well known that a fiber core requires a cladding of lower refractive index. This prevents loss of light from the core during transmission of the light.

Except for the property of refractive index, it is desirable that the properties of a cladding glass closely match those of a core glass in a clad fiber. Accordingly, it is common practice to use glasses of the same composition family for the core and the cladding. The cladding glass will have the same composition as that of the core glass, except as it is modified to impart a lower refractive index.

FIG. 1 illustrates an embodiment of the device of the present invention. Preferably, a clad fiber 3, as described above, is utilized. However, any glass article, such as a piece of bulk glass (not shown), can be used. Fiber 3 acts as a path for the polarized light. Conductor 4 carries the current to produce a magnetic field. Preferably, fiber 3 is wrapped around conductor 4, as shown, to increase the length of the light path. Also, it is preferable that fiber 3 be insulated from the conductor.

The device also includes a source of light rays 1, the source being located such that light rays are directed to an input end of fiber 3. Typically, the source of light rays 1 is a laser. A polarizer 2 is located adjacent to source of light rays 1 such that the light rays are linearly polarized. An analyzer 5 is located at an output end of fiber 3.

Analyzer 5 derives a rotatory, polarization component produced in proportion to the current flowing through the conductor 4. Also included is a means 8 for indicating the measured current corresponding to the output of analyzer 5. Typically, the means 8 is a light detector 6, and a display device 7. Light detector 6 receives and detects the output of analyzer 5. Device 7 receives the output of, and provides a display of, the output of the light detector 6.

Optionally, the analyzer may be a Wollaston prism, as described by Yamashita et al. Then, the light ray output from the fiber is broken into two orthogonal polarizations. Means 8 detects the output of each signal, and indicates the measured current corresponding to the output.

Electrical current, in a normal power station operation, can be determined by employing a glass current sensor, preferably in the form of a clad fiber. In order to avoid the effect of birefringence, it is desirable to employ a glass having a low photoelastic coefficient, preferably zero or near-zero. The Verdet constant of the glass may then ordinarily be large to enhance the sensitivity of the determination.

In measuring exceptionally large currents, the requirements of the glass sensor differ. It is still desirable to have a low, near-zero photoelastic coefficient to avoid birefringence effects. However, as explained earlier, a sensor glass must have properties such that the angle of rotation of the polarized light does not exceed 90°.

Heretofore, fused silica has provided the smallest Verdet constant available in an inorganic glass, the value being 0.1°/kA at 1150 nm. Unfortunately, fused silica also has a large photoelastic coefficient, 3.5 (nm/cm)/(kg/cm$^2$), at 560 nm. This has led to a search for a glass of comparable Verdet constant and a low, near-zero photoelastic coefficient.

It has been observed that lead silicate glasses, commonly known as heavy flint glasses, have a zero value photoelastic coefficient. However, they also have a Verdet constant that is greater than 0.50°/kA. This is acceptable for measuring ordinary, low current values, but an unusually large current, such as occasioned by a surge or short circuit, can not be accurately measured. This is because of the risk that the angle of rotation may exceed 90°.

In order to accurately measure such large currents, it is necessary to provide a glass fiber sensor having a low Verdet constant in conjunction with a low photoelastic coefficient. This problem is resolved in a companion application by using a fluoride glass. However, it would be desirable to employ a more easily melted glass.

We have found that the Verdet constant value of a heavy flint glass can be decreased, while still maintaining a photoelastic coefficient value that is adequately low. In particular, it is possible to provide a fiber-core glass that has a Verdet constant value that is not over 0.30°/kA, preferably less than 0.25°/kA. At the same time, the value of the photoelastic coefficient is maintained at not over 0.30 (nm/cm)/(kg/cm$^2$).

This is accomplished by incorporating, in the composition of a heavy flint glass, a source of an ion that imparts paramagnetic behavior to the glass. The heavy flint glass, like most glasses, is characterized by diamagnetic behavior. Conventionally, this has been depicted as imparting a clockwise rotation to polarized light.

The presence in the glass of a selected rare earth ion having an effective unfilled electron in the "f" shell creates an opposite effect known as paramagnetic behavior. This behavior imparts an opposite rotation to polarized light. This opposite rotation may be thought of as a counterclockwise rotation. This tends to cancel, to some extent at least, the normal diamagnetic behavior of the glass. As a result, the angle of rotation of polarized light in the glass core, caused by any given current, is diminished.

The paramagnetic effect is temperature dependent, whereas the diamagnetic effect is not. The error, thus created, tends to be negligible where variations in temperature are minor. Where temperature variations are more severe, or where precise data are required, it may be necessary to control the temperature of the measuring device.

The invention contemplates adding, to the heavy flint glass composition, a source of an ion of a rare earth element that imparts paramagnetic behavior due to an unfilled electron shell. It is the action of this unfilled electron shell, as contrasted to that of the more common, filled electron shell, on magnetic lines of force that creates the opposite effect on the angle of rotation.

The rare earth elements that are effective as ions, or ion mixtures, in a glass to exert a paramagnetic effect are: Tb, Nd, Pr, Dy, Ho, Er and Tm. Transition elements also have unfilled electron shells. However, as is well known, they impart color, thereby reducing transmission in the visible and UV portions of the spectrum. Accordingly, they are not considered useful with visible or ultraviolet, polarized light.

The rare earth elements are customarily shown in glass compositions as oxides. However, it is their presence in the glass in ionic form that is effective for present purposes.

They may simply be added as an additional component in a heavy flint composition. However, it is generally preferred to substitute them for lead. This is because that is the predominant component in the glass, and has the predominant effect on diamagnetic behavior.

In general, we prefer to use the terbium ion for a paramagnetic effect. it is quite effective in producing a large, negative angle of rotation. It can be incorporated in a heavy flint glass in substantial amounts, thus offering flexibility. It, of course, provides the necessary transparency for use. Accordingly, further description of the invention is made with respect to this oxide.

It will be understood that any of the other effective oxides might be substituted for Tb$_2$O$_3$ with similar, although not necessarily identical, effect. The degree to which any oxide is substituted will be determined by the degree of effect desired, and by the ability to incorporate the oxide in a homogeneous, glass melt.

In its simplest form, a heavy flint glass is a lead silicate glass consisting essentially of, as calculated in weight %, 20–42% SiO$_2$, 50–80% PbO and, optionally, 0–8% K$_2$O. The substitution of x% of an ion of an element exhibiting paramagnetic behavior creates a composition consisting essentially of, in weight %, 20–42% SiO$_2$, 50–(80-x)% PbO, x% of an oxide of the substituted element and, optionally, 0–8% K$_2$O.

TABLE I, below, shows five glass compositions. Three are in accordance with the present invention, one is a commercial heavy flint glass, and one is fused silica. The latter two are for comparison. The TABLE shows the compositions in weight %. It also shows the Verdet constant (V) value for each glass, as measured in °/kA at a wavelength of 1150 nm, and the photoelastic coefficient (B) value, as measured in (nm/cm)/(kg/cm$^2$) at 546 nm.

TABLE I

| wt. % | 1 | 2 | 3 | G | SiO$_2$ |
|---|---|---|---|---|---|
| SiO$_2$ | 24.6 | 24.6 | 24.6 | 24.6 | 100 |
| Na$_2$O | 0.5 | 0.5 | 0.5 | 0.5 | — |
| K$_2$O | 0.5 | 0.5 | 0.5 | 0.5 | — |
| PbO | 68 | 66 | 64 | 74 | — |
| TbO$_2$ | 6 | 8 | 10 | — | — |
| As$_2$O$_3$ | 0.3 | 0.3 | 0.3 | 0.3 | — |
| V | 0.23 | — | 0.08 | 0.53 | 0.1 |
| B | 0.25 | 0.29 | 0.30 | 0.0 | 3.5 |

Glass batches were prepared in conventional manner by mixing conventional, glass forming materials, including pure sand, oxides of lead, terbium and arsenic, and nitrates of sodium and potassium. Arsenic oxide was included as a fining agent, and the alkali metal oxides served to stabilize the glass.

Each glass batch was placed in a melting vessel and held at a temperature of about 1100° C. for three (3) hours. The melt was homogenized by pouring between crucibles while melting. The homogenized melt was cooled to 900° C. and poured in molds to form 13×13 cm (5"×5") patties. The glass was annealed at 350° C. Each glass was then placed in a double crucible in conjunction with a cladding glass of similar composition, but lower refractive index. Clad fibers were drawn from each combination for measurement purposes.

The invention has been described in relatively specific terms. However, the more general scope of the invention encompasses variations that will be apparent to those familiar with the art and that are included within the scope of the claims that follow.

We claim:

1. A glass fiber sensor for measuring an electrical current detected when the glass fiber sensor is positioned in a magnetic field created by the electrical current, the glass fiber sensor having a glass core, the composition of the glass core being a heavy flint base glass exhibiting a diamagnetic behavior modified by incorporating a rare earth ion that imparts a paramagnetic behavior to the glass core, thereby canceling at least in part the diamagnetic behavior of the base glass.

2. The glass fiber sensor of claim 1 wherein the glass core has a Verdet constant value not over about 0.30°/kA and a photoelastic coefficient value not over about 0.30 (nm/cm)/(kg/cm$^2$).

3. The glass fiber sensor of claim 2 wherein the glass [fiber] core has a Verdet constant not over about 0.25°/kA.

4. The glass fiber sensor of claim 1 wherein the rare earth ion is selected from an elemental group consisting of Tb, Nd, Pr, Dy, Ho, Er, or Tm.

5. The glass fiber sensor of claim 4 wherein the rare earth ion is Tb.

6. The glass fiber sensor of claim 1 wherein the glass core consists essentially of, as calculated on an oxide basis in weight percent, 20–42% $SiO_2$, 0–8% $K_2O$, 50–(80-x)% PbO, and x% of the oxide of the rare earth ion, the oxide of the rare earth ion plus the PbO content being greater than 50% but not over 80%.

7. A method for reducing a Verdet constant value of a glass fiber sensor while not unduly increasing a photoelastic coefficient of the glass fiber sensor, the glass fiber sensor having a heavy flint glass core exhibiting a diamagnetic behavior, a polarized light passing through the heavy flint glass core experiencing rotation at an angle, the method comprising the step of;

incorporating throughout the heavy flint glass core a source of a rare earth ion that imparts a paramagnetic behavior to the heavy flint glass core, thereby canceling at least in part the effect of the diamagnetic behavior of the heavy flint glass core on the angle of rotation imparted to the polarized light passing through the lass fiber sensor.

8. The method of claim 7 wherein the method reduces the Verdet constant value of the heavy flint glass core to not over 0.30°/kA while maintaining the photoelastic coefficient at a value not over about 0.30 $(nm/cm)/(kg/cm^2)$.

9. The method of claim 7 wherein the rare earth ion is selected from an elemental group consisting of Tb, Nd, Pr, Dy, Ho, Er, or Tm.

10. The method of claim 7 wherein the heavy flint glass core contains a lead oxide and the step of incorporating comprises:

substituting an oxide of the rare earth ion for the lead oxide throughout the heavy flint glass core.

11. A method for determining the magnitude of an electrical current in a conductor, the method comprising the steps of:

providing a glass fiber current sensor having a core glass, the core glass being a heavy flint glass containing a rare earth ion that imparts a paramagnetic behavior to the core glass;

passing the electrical current through the conductor to create a magnetic field surrounding the conductor;

positioning the glass fiber current sensor within the magnetic field;

propagating polarized light through the glass fiber current sensor;

measuring an angle of rotation of the polarized light propagating through the glass fiber current sensor; and determining the magnitude of the electrical current from the angle of rotation of the polarized light propagating through the glass fiber current sensor.

12. The method of claim 11 in which the core glass of the glass fiber current sensor has a Verdet constant value and contains a sufficient amount of the rare earth ion such that the Verdet constant value is not over 0.30°/kA.

13. The method of claim 11 in which the rare earth ion is selected from an elemental group consisting of Tb, Nd, Pr, Dy, Ho, Er, or Tm.

14. The method of claim 11 wherein the step of propagating polarized light through the glass fiber current sensor comprises the steps of:

providing a laser which produces light;

providing a polarizer; and transmitting the light from the laser through the polarizer into the glass fiber current sensor.

15. A heavy flint glass for use in a device such as a glass fiber current sensor disposed in a magnetic field surrounding a conductor, the heavy flint glass having a composition comprising a lead oxide, a silicon oxide, and an oxide of a rare earth ion that imparts a paramagnetic behavior in the heavy flint glass that cancels at least in part a diamagnetic behavior of the heavy flint glass exhibited in the magnetic field surrounding the conductor, the composition as calculated in weight percent on an oxide basis being 20–42% $SiO_2$, 50–(80-x)% PbO, and x% of the oxide of the rare earth ion distributed throughout the composition a total content of the oxide of the rare earth ion plus the PbO being greater than 50% but not over 80%.

16. The heavy flint glass of claim 15 wherein the oxide of the rare earth ion is selected from a group consisting of $Tb_2O_3$, $Nd_2O_3$, $Pr_2O_3$, $Dy_2O_3$, $Ho_2O_3$, $Er_2O_3$, or $Tm_2O_3$.

17. The heavy flint glass of claim 15 further comprising: 0–8% $K_2O$.

* * * * *